United States Patent
Chan

(10) Patent No.: US 11,907,572 B2
(45) Date of Patent: Feb. 20, 2024

(54) INTERFACE READ AFTER WRITE

(71) Applicant: Micron Technology, Inc., Boise, ID (US)

(72) Inventor: Yue Chan, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 16/928,564

(22) Filed: Jul. 14, 2020

(65) Prior Publication Data

US 2021/0200470 A1 Jul. 1, 2021

Related U.S. Application Data

(60) Provisional application No. 62/954,869, filed on Dec. 30, 2019.

(51) Int. Cl.
G06F 3/06 (2006.01)
G11C 29/44 (2006.01)
G11C 29/42 (2006.01)

(52) U.S. Cl.
CPC .......... *G06F 3/0659* (2013.01); *G06F 3/0619* (2013.01); *G06F 3/0653* (2013.01); *G06F 3/0673* (2013.01); *G11C 29/42* (2013.01); *G11C 29/44* (2013.01)

(58) Field of Classification Search
None
See application file for complete search history.

(56) References Cited

U.S. PATENT DOCUMENTS

| | | | | |
|---|---|---|---|---|
| 5,280,579 A | * | 1/1994 | Nye | G06F 12/0646 345/559 |
| 7,733,879 B2 | | 6/2010 | Herbst | |
| 8,239,607 B2 | | 8/2012 | LaBerge | |
| 8,634,267 B2 | | 1/2014 | Tam | |
| 8,762,682 B1 | * | 6/2014 | Stevens | G06F 9/3004 711/155 |
| 2008/0126642 A1 | * | 5/2008 | Shelor | G06F 13/1673 710/113 |
| 2010/0211746 A1 | * | 8/2010 | Tsukishiro | G06F 12/0804 711/143 |
| 2014/0040550 A1 | * | 2/2014 | Nale | G06F 12/0897 711/118 |
| 2014/0143476 A1 | * | 5/2014 | Sela | G06F 3/0619 711/103 |
| 2014/0372696 A1 | * | 12/2014 | Tune | G06F 12/0846 711/114 |
| 2016/0110250 A1 | * | 4/2016 | Han | G06F 12/0895 714/766 |
| 2017/0194039 A1 | * | 7/2017 | Funaki | G11C 7/10 |
| 2019/0205059 A1 | * | 7/2019 | Cho | G06F 3/0604 |

FOREIGN PATENT DOCUMENTS

JP 2008009699 A 1/2008

* cited by examiner

*Primary Examiner* — Sanjiv Shah
*Assistant Examiner* — Alexander J Yoon
(74) *Attorney, Agent, or Firm* — Brooks, Cameron & Huebsch, PLLC

(57) ABSTRACT

An interface of a memory sub-system can receive a write command addressed to a first address and a read command addressed to a second address and can receive data corresponding to the write command. The interface can determine whether the first address matches the second address responsive to determining that the first address matches the second address, can drop the read command and the second address, and can provide the data to a host.

17 Claims, 4 Drawing Sheets

INTERFACE READ AFTER WRITE

PRIORITY INFORMATION

This application claims priority to U.S. Provisional Application Ser. No. 62/954,869, filed Dec. 30, 2019, the contents of which are incorporated herein by reference.

TECHNICAL FIELD

Embodiments of the disclosure relate generally to memory sub-systems, and more specifically, relate to implementing read after write commands in an interface.

BACKGROUND

A memory sub-system can include one or more memory devices that store data. The memory devices can be, for example, non-volatile memory devices and volatile memory components. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
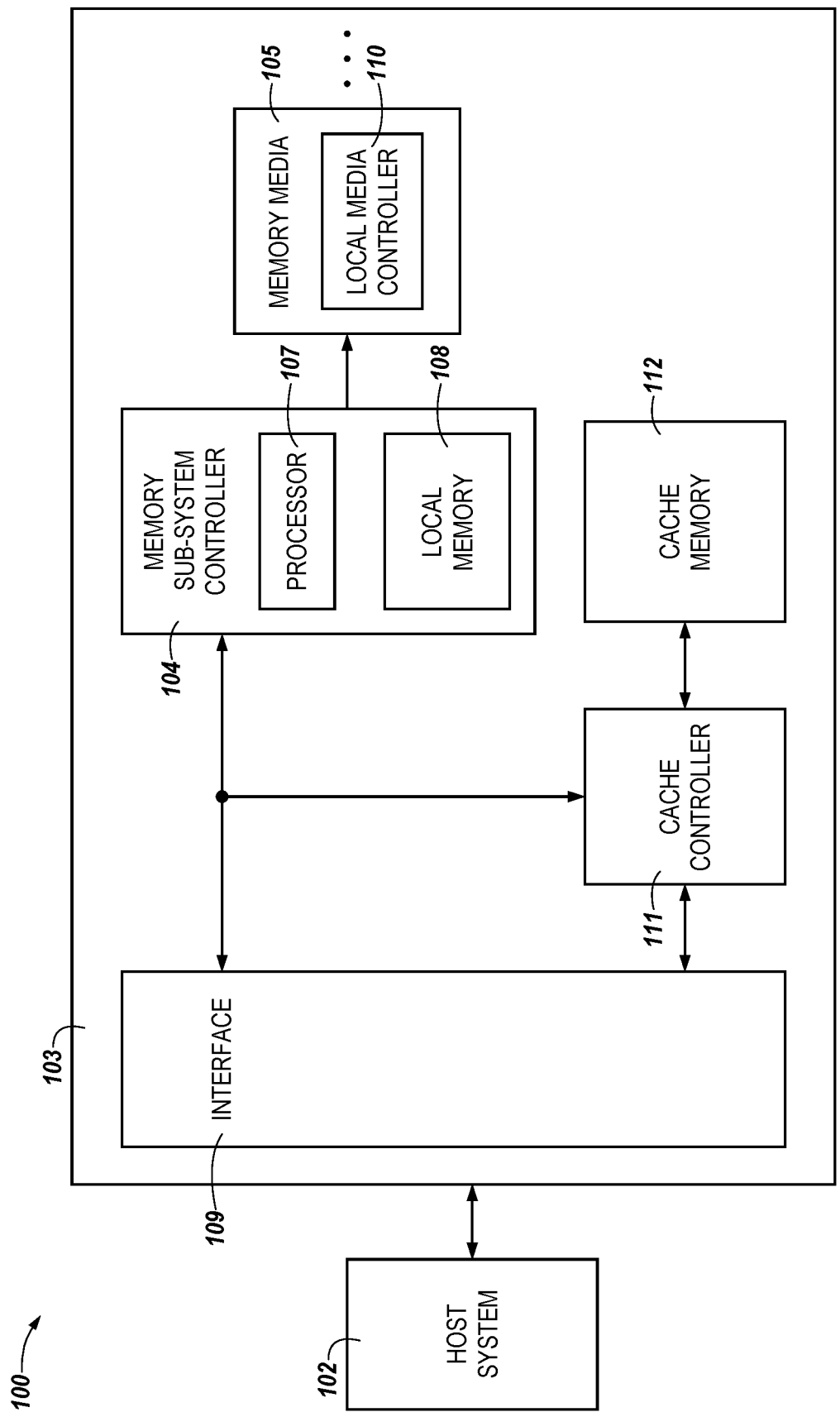
FIG. 1 illustrates an example computing system that includes a memory sub-system comprising an interface and a cache controller in accordance with some embodiments of the present disclosure.

Aspects of the present disclosure are directed to memory sub-systems that implement read after write commands in a memory interface. A memory sub-system can be a storage device, a memory module, or a hybrid of a storage device and memory module. Examples of storage devices and memory modules are described below in conjunction with FIG. 1. In general, a host system can utilize a memory sub-system that includes one or more devices, such as memory devices that store data. The host system can provide data to be stored at the memory sub-system and can request data to be retrieved from the memory sub-system.

The host system can send access requests (e.g., write commands, read commands) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information can be part of metadata for the host data.

The memory sub-system can receive a read command after receipt of a write command. The read command can be received prior to execution of the write command and after receipt of the write command. The read command and the write command can be addressed to a same address and/or a same logical block of a memory device of the memory sub-system. In some instances, it can be beneficial to process the read command without retrieving data from a memory device. For example, a conventional cache controller of a memory device may be able to retrieve the data from a cache memory to service the read command. However, retrieving the data from the cache memory can utilize processing devices of the cache controller.

Aspects of the present disclosure address the above and other deficiencies. An interface of a memory sub-system can receive a read command after the receipt of a write command to a same address. As used herein, a same address can reference a same logical address, a same physical address, and/or a same logical block. The interface can provide data corresponding to the write command to processes the read command. The data can be provided to a host as a response to receipt of the read command. Processing write commands in the interface of the memory sub-system can offload work from the cache controller to the interface, which can free up resources of the cache controller to process other commands. The read commands that are handled (e.g., processed) in the interface can be handled with a smaller latency as compared to read commands that are processed in a cache controller by retrieving data from cache memory and/or a memory device of a memory sub-system.

The figures herein follow a numbering convention in which the first digit or digits correspond to the drawing figure number and the remaining digits identify an element or component in the drawing. Similar elements or components between different figures may be identified by the use of similar digits. For example, 109 may reference element "09" in FIG. 1, and a similar element may be referenced as 209 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 illustrates an example computing system 100 that includes a memory sub-system 103 in accordance with some embodiments of the present disclosure. The memory sub-system 103 can include media, such as one or more volatile memory devices, one or more non-volatile memory devices, or a combination of such.

A memory sub-system 103 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 102 that is coupled to one or more memory sub-systems 103. In some embodiments, the host system 102 is coupled to different types of memory sub-systems 103. FIG. 1 illustrates an example of a host system 102 coupled to one memory sub-system 103. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 102 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 102 uses the memory sub-system 103, for example, to write data to the memory sub-system 103 and read data from the memory sub-system 103.

The host system 102 can be coupled to the memory sub-system 103 via a physical host interface 109. The interface 109 can be internal to the memory sub-system 103 Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The interface 109 can be used to transmit commands, addresses, and/or data between the host system 102 and the memory sub-system 103. The host system 102 can further utilize an NVM Express (NVMe) interface to access components (e.g., memory devices 105) when the memory sub-system 103 is coupled with the host system 102 by the PCIe interface. The physical host interface can provide an interface for passing control, address, data, and other signals between the memory sub-system 103 and the host system 102. FIG. 1 illustrates a memory sub-system 103 as an example. In general, the host system 102 can access multiple memory sub-systems via a same communication connection, multiple separate communication connections, and/or a combination of communication connections.

The memory devices 105, 112 can include any combination of the different types of non-volatile memory devices 105 and/or volatile memory devices 112. The volatile memory devices (e.g., memory device 112) can be, but are not limited to, random access memory (RAM), such as dynamic random access memory (DRAM) and synchronous dynamic random access memory (SDRAM).

Some examples of non-volatile memory devices (e.g., memory device 105) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 105 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 105 and 112 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 105 and 112 can be grouped as pages that can refer to a logical unit of the memory device used to store data. With some types of memory (e.g., NAND), pages can be grouped to form blocks.

Although non-volatile memory devices 105 such as 3D cross-point array of non-volatile memory cells and NAND type memory (e.g., 2D NAND, 3D NAND) and 3D cross-point array of non-volatile memory cells are described, the memory device 105 can be based on any other type of non-volatile memory, such as read-only memory (ROM), phase change memory (PlocCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 104 (or controller 104 for simplicity) can communicate with the memory devices 105 to perform operations such as reading data, writing data, or erasing data at the memory devices 105 and other such operations. The memory sub-system controller 104 can include hardware such as one or more integrated circuits and/or discrete components, a buffer memory, or a combination thereof. The memory sub-system controller 104 can be a microcontroller, special purpose logic circuitry (e.g., a field programmable gate array (FPGA), an application specific integrated circuit (ASIC), etc.), or other suitable processor.

The memory sub-system controller 104 can include a processor 107 (e.g., processing device) configured to execute instructions stored in a local memory 108 for performing the operations described herein. In the illustrated example, the local memory 108 of the memory sub-system controller 104 includes an embedded memory configured to store instructions for performing various processes, operations, logic flows, and routines that control operation of the memory sub-system 103, including handling communications between the memory sub-system 103 and the host system 102.

In some embodiments, the local memory 108 can include memory registers storing memory pointers, fetched data, etc. The local memory 108 can also include read-only memory (ROM) for storing micro-code, for example. While the example memory sub-system 103 in FIG. 1 has been illustrated as including the memory sub-system controller 104, in another embodiment of the present disclosure, a memory sub-system 103 does not include a memory sub-system controller 104, and can instead rely upon external control (e.g., provided by an external host, or by a processor or controller separate from the memory sub-system).

In general, the memory sub-system controller 104 can receive commands or operations from the host system 102 and can convert the commands or operations into instructions or appropriate commands to achieve the desired access to the memory devices 105 and/or the memory device 112. The memory sub-system controller 104 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 105. The memory sub-system controller 104 can further include host interface circuitry to communicate with the host system 102 via the physical host interface. The host interface circuitry can convert the commands received from the host system into command instructions to access the memory devices 105 and/or the memory device 112 as well as convert responses associated with the memory devices 105 and/or the memory device 112 into information for the host system 102.

The memory sub-system 103 can also include additional circuitry or components that are not illustrated. In some embodiments, the memory sub-system 103 can include a cache or buffer (e.g., DRAM) and address circuitry (e.g., a row decoder and a column decoder) that can receive an address from the memory sub-system controller 104 and decode the address to access the memory devices 105.

In some embodiments, the memory devices 105 include a local media controller 110 that operates in conjunction with memory sub-system controller 104 to execute operations on one or more memory cells of the memory devices 105. An external controller (e.g., memory sub-system controller 104) can externally manage the memory device 105 (e.g., perform media management operations on the memory device 105). In some embodiments, a memory device 105 is a managed memory device, which is a raw memory device combined with a local controller (e.g., local controller 110) for media management within the same memory device package. An example of a managed memory device is a managed NAND (MNAND) device.

In at least one embodiment, the interface 109 is compatible with the DDR-4 NVDIMM-P protocol and has pins that are compatible with the DDR-4 NVDIMM-P physical slot. For example, the interface 109 can include an NVDIMM-P CA physical layer (PHY), NVDIMM-P event PHY, and NVDIMM-P DQ PHY. The NVDIMM-P command/address (CA) PHY can be coupled to a command decode for handling host commands. The interface 109 can include memory (e.g., content addressable memory) for storing commands and addresses associated therewith. The interface 109 can compare the commands received from the host system 102 to determine whether there are two or more write commands to a same address of the memory device 105, among other possible memory devices.

The NVDIMM-P CA PHY can be configured to share a single alert signal for parity errors and uncorrectable ECC (UECC) errors. However, the wait times and pulse widths are different for parity errors and UECC errors on the single alert signal. In some embodiments, the NVDIMM-P CA PHY can be coupled to a parity register and an error register. The parity register can be configured to keep track of the wait time and pulse width for the single alert signal for parity errors. The error register can be configured to keep track of the wait time and pulse width for the UECC errors. A single alert generation logic can generate the alert signal with the appropriate assertion time (e.g., from the wait time) and pulse width based on the type of error (parity or UECC) using the parity register and error register. The registers can be programmed with the respective wait times and pulse widths.

The NVDIMM-P DQ PHY can be coupled to error circuitry and via the error circuitry to a write buffer for writing data to the memory sub-system 103. The error circuitry can be included in the interface 109. The error circuitry is described in more detail with respect to FIG. 2. The NVDIMM-P DQ PHY can also be coupled to a read buffer for receiving data from the memory sub-system 103.

The NVDIMM-P DQ PHY can be coupled to the command decode to provide an indication to the host that the memory sub-system 103 is ready to receive a command therefrom. In some embodiments, the command decode can provide such an indication based on an available amount of write credits. The interface 109 can have a memory dedicated to storing write credits from the cache controller 111. In at least one embodiment, each write command equates to one write credit. For each write command that the interface 109 provides to the cache controller 111, one write credit is consumed. Once the cache controller 111 has processed the write command, it can release the write credit by signaling the interface 109 to indicate that the write is complete. As a non-limiting example, the interface 109 can store 10 write credits, meaning that the interface 109 can have at most 10 outstanding write commands for the cache controller, after which the interface 109 would indicate to the host 102 that additional write commands cannot be received therefrom.

Figure 2:
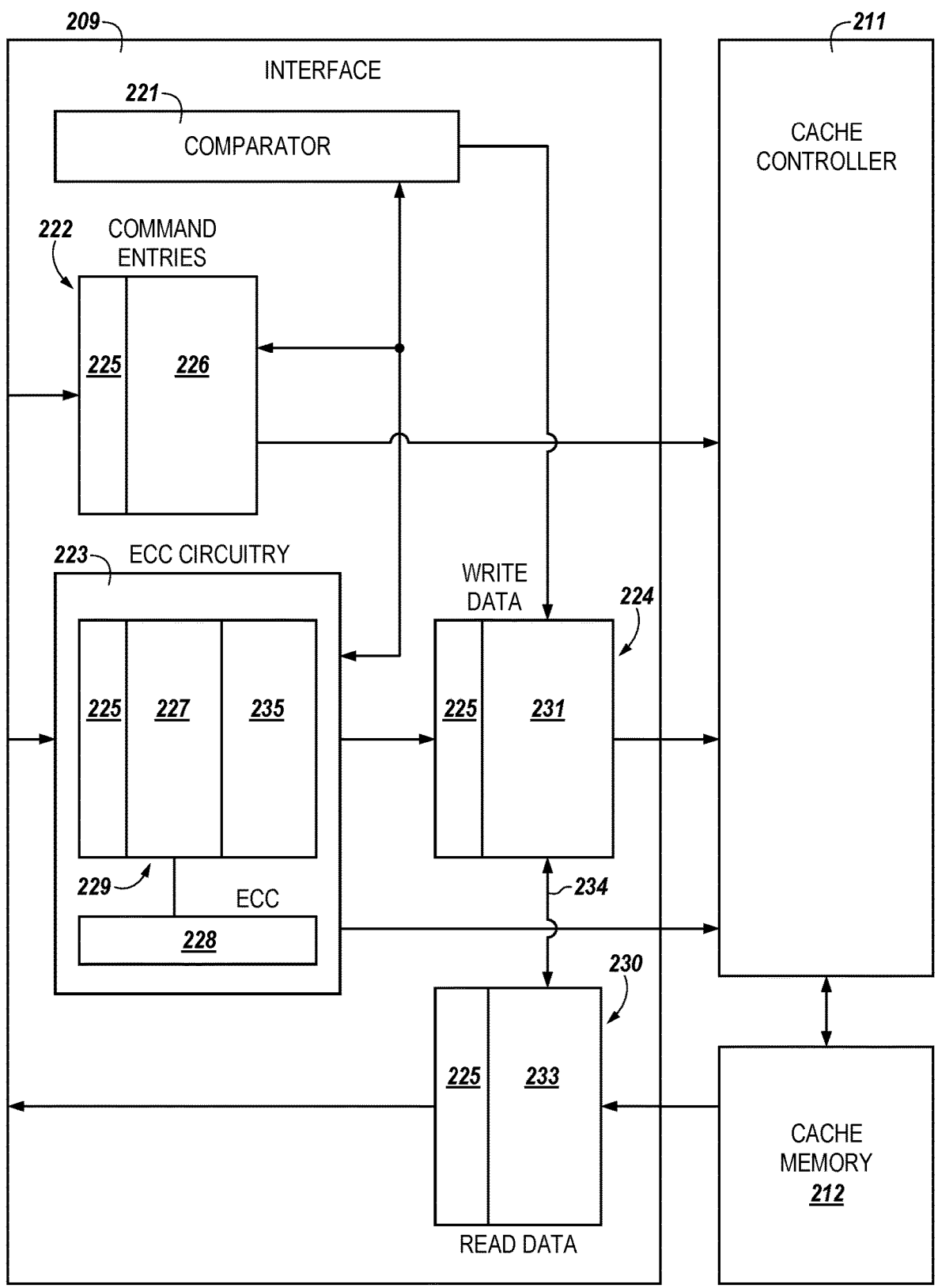
FIG. 2 illustrates an example of an interface of a computing system in accordance with some embodiments of the present disclosure.

Some additional detail of the interface 109 is illustrated and described with respect to FIG. 2. Ultimately, the interface 109 is coupled to the memory sub-system controller 104 (and thus to the memory device 105) and to the cache controller 111 (and thus to the cache memory 112 because the cache controller 111 is coupled to the cache memory 112). The cache controller 111 can also be coupled to the memory sub-system controller 104.

In order to provide large capacity and persistent storage, the backend of the memory sub-system 103 includes a 3D cross-point array of non-volatile memory cells as the memory device 105. However, 3D cross-point memory has much higher latency than typical DRAM. Thus, in order to narrow down the latency gap between typical DRAM and the 3D cross-point memory, the memory sub-system 103 includes a higher speed cache memory 112 between the backend storage provided by the memory device 105 and the interface 109. The cache memory 112 can include DRAM, SRAM, reduced latency DRAM third generation (RL-DRAM3), or a combination thereof. RLDRAM3 is a type of DRAM with an SRAM-like interface. RLDRAM3 generally has lower latency and greater capacity than SRAM. RLDRAM3 generally has better performance than DRAM, particularly for back-to-back read and write accesses or completely random access.

The NVDIMM-P event PHY can be coupled to an event manager for receiving reports of events in the memory sub-system 103. For example, the event manager can receive a ready signal from the memory sub-system 103 (or a transfer manager associated therewith). The ready signal can indicate any response or event (e.g., urgent events, interrupts, read ready, etc.) from any source. Such responses or events can be simultaneous for different sources. The responses or events can be serialized by the event manger. The event manager can use a single response counter to keep track of the responses and events. Whenever any response is ready or event occurs, the single response counter increments by one (even for simultaneous occurrences). The single response counter can set a flag for urgent events that are pending. In response to the flag being set, once a currently occurring event or response completes, the oldest flagged urgent event can be handled. Urgent events can be given priority by operation of the single response counter.

The cache controller 111 can manage the commands, addresses, and/or data received from the host 102 (intended for the memory device 105) and store the same in the cache memory 112 before the commands are executed and/or the data is stored in the memory device 105. The associated commands and/or addresses can be stored in memory internal to the interface 109 and be operated on by a command builder and/or command manager (not specifically illustrated) before being transferred to the cache controller 111 as described herein. In some embodiments, the cache memory 112 can store data retrieved from the memory device 105 before being sent to the host 102. The cache memory 112 can be read from and written to faster than the memory device 105. As such, it may be beneficial to read and write to the cache memory 112 instead of the memory device 105 to provide for a low latency in executing write commands and/or read commands.

The interface 109 can mark the write command addressed to a same address as a read command. The interface can mark a command by adding or modifying metadata associated with the command. For example, the interface can add a bit to the metadata associated with the command indicating that the command has been marked. The marked commands can be used to determine whether to forward the data corresponding to the marked commands to a read buffer of the interface 109. The read buffer can be used to provide data to the host system 102. The interface 109 can drop (e.g., delete) the read command responsive to providing the data stored in the read buffer to a host system 102. The interface 109 can drop read commands without providing the read commands to the cache controller 111 and/or processing the read commands utilizing the cache controller 111. The interface 109 can, in response to receiving a read command addressed to a same address as a write command for which the accompanying data is still in the interface (e.g., in a write buffer), cause the accompanying data to be stored in a read buffer, cause the accompanying data to be transmitted to the host from the read buffer to satisfy the read command, and delete the read command (without actually executing the read command with respect to the cache memory 112 or the memory device 105).

Marking the write commands in the interface 109 can reduce the workload of the cache controller 111. In some embodiments, the write commands can be marked from outside of the interface 109 and cache controller 111 and be dropped by the interface 109.

In various instances, the cache controller 111 can move data from the memory device 105 to the cache memory 112 without the use of the memory sub-system controller 104. The cache controller 111 can also move data from the memory device 105 to the cache memory 112 with the use of the memory sub-system controller 104.

FIG. 2 illustrates an example of an interface 209 of a computing system in accordance with some embodiments of the present disclosure. The interface 209 is analogous to the interface 109 of FIG. 1. The interface 209 can include a comparator 221, a command buffer 222, a write buffer 224, and a read buffer 230, referred to generally as "buffers 222, 224, and 230." The interface can also include error correction circuitry, which is labeled "ECC circuitry 223" for convenience. The ECC circuitry 223 can be error detection and/or correction circuitry, such as correction code (ECC) circuitry, cyclic redundancy check (CRC) circuitry, other error detection and/or correction circuitry, or combinations thereof.

As used herein, the buffers 222, 224 and 230 and/or the error memory 229 can include data structures that are stored in memory such as SRAM or different types of memory. For example, the buffers 222, 224, and 230 and the error memory 229 can be stored in registers. The buffers 222, 224, and 230 can be first-in first-out (FIFO) data structures that retain an order associated with receipt of commands (e.g., read commands and/or write commands), addresses, and/or data.

The interface 209 can receive commands, addresses, and/or data. The commands received by the interface 209 can be decoded by a command decode, for example. The commands received can be used to read or write data to a memory device of the memory sub-system (e.g., memory sub-system 103 of FIG. 1). For example, a command can be used to write data received by the interface 209 to an address also received by the interface 209. That address can be an address of memory cells of a memory device of a memory sub-system hosting the interface.

The data received by the interface 209 can be provided to a cache controller 211 for temporary storage in cache memory 212 before being provided to the memory sub-system for storage in a memory device of the memory sub-system. As such, a write command to an address of the memory device can be implemented by storing data corresponding to the write command to the cache memory 212. When the memory sub-system is ready, the data stored by the cache memory 212 can be provided to the memory device according to the address associated with the write command. In at least one embodiment, the host that sent the write command and associated address may be unaware that the data is temporarily stored in cache memory 212 before being stored in the addressed location.

In various examples, identifications (IDs) 225 can be assigned to write commands and/or read commands prior to the write commands and/or the read commands being received by the interface 209. For example, the IDs 225 can be assigned to the write commands and/or the read commands by a host. The read commands can be assigned read ID's and the write commands can be assigned write ID's. The command buffer 222 can store the IDs 225 and addresses 226 corresponding to the write commands and/or read commands. For example, each entry in the command buffer 222 can include a write ID or a read ID and an address, where the write ID and the address correspond to the write command and the read ID and the address correspond to read command. The addresses 226 corresponding to read commands can identify memory cells that are to be read. The addresses 226 corresponding to write commands can identify memory cells that are to be written to. The addresses 226 can be physical addresses and/or logical addresses, among other types of memory addresses that can be used. In at least one embodiment, the command buffer 222 can store the IDs 225 and addresses 226 until a corresponding write command has been executed by the memory sub-system associated with the relevant address. For example, the command buffer 222 can store a particular write ID 225 and address 226 before the write command and accompanying data have been provided to the cache controller 211 and before the write command and accompanying data have been provided to the memory sub-system. Such embodiments can be beneficial in allowing the interface 209 to provide the write data from the interface 109 to the host and to drop the read command from a command pipeline before the read command is provided to the memory sub-system or executed thereby.

The comparator 221 can compare the addresses 226 to determine whether any two or more of the addresses 226 are a same address or overlapping addresses. For example, the comparator 221 can compare a first write ID having a first address with a second read ID having a second address. If the first address and the second address match, then the comparator 221 can determine that the commands having the first write ID and the second read ID can be implemented to write and read, respectively to a same address of a memory device. The determination that multiple commands write and read to a same address can be used to identify the write commands and read commands that write and read, respectively, to a same address a memory device of the memory sub-system.

The command IDs can be assigned sequentially based on an order in which the commands are received from a host. In various instances the comparator 221 can also determine whether the read command was received after the write command was received. For example, the comparator 221 can compare IDs of the write and read commands to determine if the write ID is a lesser number than the read ID. In some embodiments, the comparator 221 can determine whether the write command was inserted into the command buffer 222 prior to the insertion of the read command into the command buffer 222. The determination that a write command is addressed to a same address as the read command, and that the write command was received prior to the receipt of the read command can be used to identify the write commands and/or read commands.

Responsive to determining that the identified commands write to a same address, the comparators 221 can mark the commands and/or the corresponding ID's 225. The comparators 221 can cause the ECC circuitry 223 to mark the identified write commands and/or read commands by sending a signal to the ECC circuitry 223 indicating the same. In such an example, the ECC circuitry 223 can mark the later received read command as being erroneous without regard to performing an error check on the read command (or accompanying data) and/or without regard to whether the read command (or accompanying data) pass an error check if performed. Marking the read command can include setting a bit in metadata of the read command. The interface 209, the cache controller 211, and/or the memory sub-system controller can be configured to read the bit from the metadata of the read command and in response to the bit being set, can delete the read command.

The ECC circuitry 223 can include error memory 229 and circuitry 228 ("ECC 228") configured to operate according to error correction code. The error memory 229 can store IDs 225, ECC results 227 of the ECC 228, and a determination of whether the IDs 225 correspond to write commands addressed to a same address as read commands. Conventional ECC circuitry 223 does not store a determination of whether the IDs 225 correspond to write commands addressed to a same address as read commands. The ECC circuitry 223 can operate according to the ECC 228 to detect and/or correct corruptions of data corresponding to the commands received by the interface 209. The ECC circuitry 223 can identify data that is free of corruptions and/or data that includes corruptions according to the ECC 228. The ECC circuitry 223 can identify data that is corrupt utilizing the error memory 229. The error memory 229 can store entries comprising the write IDs (e.g., IDs 225) and the ECC results 227. Associating write IDs 225 with ECC results 227 of data received by the interface 209 can allow for the association of data and write commands. For example, each entry in the error memory 229 can include a write ID corresponding to a write command and a result of the ECC 228. The ECC 228 can determine whether data is corrupt. For example, the ECC 228 can determine whether data corresponding to the write ID is corrupt. The determination can be stored in the error memory 229 as an ECC result 227.

The error memory 229 can also store a determination of whether a write command having a write ID 225 has a same address as a corresponding read command having a read ID. The error memory 229 can store the determination in a field which represents read-after-write results 235. For instance, the comparator 221 can, responsive to identifying read-after-write dependence, store the read-after-write results 235 in the error memory 229. As used herein, read-after-write dependence describes the receipt of a read command after the receipt of a write command, where the read command and the write command are addressed to a same address. For example, a bit having a particular value can represent that no read-after-write dependence exists while the bit having a different value can represent that a read-after-write dependence exists.

The write data received by the interface 209 can be stored in the write buffer 222 after the ECC 228 has determined that the write data is not corrupt. For example, the data can be provided from the ECC circuitry 223 to the write buffer 222. Each entry to the write buffer 222 can include a write ID and data corresponding to a write command. The result of the ECC 228, the data 231, the write IDs 225, the read IDs 225, and/or the addresses 226 can be provided to the cache controller 211 if the error memory 229 indicates that no read-after-write dependence exists. If a read-after-write dependence exists, then the ECC 228, the data 231, the write IDs 225 and the corresponding addresses 226 can be provided to the cache controller 211. The read command and any associated addresses may not be provided to the cache controller 211 from the command buffer 222 responsive to the read-after-write results 235 indicating that a read command and a write command are addressed to a same memory address.

In various instances, the read-after-write results 235 and the ECC results 227 can be used to determine whether to provide a write command and/or a read command to the cache controller 211. For example, if the ECC results 227 indicates that data corresponding to a write command is corrupt, then a write command and read command addressed to a same address and/or different address can both be provided to the cache controller 211. An indication that write data is corrupt as indicated by the ECC results 227 renders the write data inaccessible and as such can be precluded from being utilized to fulfill a corresponding read command. If the ECC results 227 indicate that data corresponding to a write command is not corrupt and the read-after-write results 235 indicate that a write command is addressed to a same address to which a read command is addressed, then the interface can provide the write command but not the read command to the cache controller 211. The write data can be used to fulfill the read command given that the write data is to be stored to a same address that would be read to process the read command. If the ECC results 227 indicate that data corresponding to a write command is not corrupt and the read-after-write results 235 indicate that a write command is addressed to a different address to which a read command is addressed, then the interface 209 can provide the write command and the read command to the cache controller 211. However, the interface 209 may not utilize the write data to fulfill the read command given that a different address, than the address to which the write data is stored, would be read to fulfill the read command. The cache controller 211 can execute the read command and write command that it receives.

The write data 231 stored in the write buffer 224 can be provided to the read buffer 230 responsive to an identification of a read-after-write dependence and no indication that the write data 231 is corrupt. The write data 231 can be provided to the read buffer 230 via one or more lines 234. The lines 234 can couple the write buffer 224 to the read buffer 230 such that data can be provided from the write buffer 224 to the read buffer 230. As such, the read-after-write results 235 and the ECC results 227 can be used to determine whether to forward data from the write buffer 224 to the read buffer 230.

If data is provided to the read buffer 230 from a write buffer 224, then the write command and/or an associated write ID can be dropped from the command buffer 222 given that the data can be provided to a host system from the read buffer 230. As such, processing the read command, in this instance, includes determining whether there is a read-after-write dependence, storing the data corresponding to the write command in the read buffer 230 from the write buffer 224, and providing the data to a host from the read buffer 230. The read command can be processed without providing the read command to the cache controller 211, without accessing a cache memory 212, without providing the read command to a memory sub-system controller, and/or without providing accessing a memory device of the memory sub-system.

In some examples, the comparator 221 can include circuitry configured to determine whether a read-after-write dependence exists as identified by the error memory 229 (e.g., read-after-write results 235). If a read-after-write dependence is identified, then the comparator 221 can identify a write ID 225 associated with the read-after-write dependence from the error memory 229. The write ID 225 can be cross referenced to a read ID 225 that was stored by the comparator 221 by the comparator responsive to determining that a write command and a read command are addressed to a same address. The comparator 221 can then access the write data 231 from the write buffer 224 utilizing the write ID and store the write data as read data to the read buffer 230 utilizing the read ID. For example, the comparator 221 can cause the creation of a new entry in the read buffer 230 comprising the read ID and the write data as read data. The write data can be stored to the read buffer 230 without the transfer of data from the cache memory 212 to the read buffer 230 or without the transfer of data from a different memory device of the memory sub-system to the read buffer.

The comparator 221 can mark the commands that read from a same address as a pending write command utilizing the ECC circuitry 223. For example, the comparator 221 can mark commands that read from the same address as a pending write command in the error memory 229. For instance, the comparator 221 can identify write IDs and read IDs corresponding to write commands and read commands that are addressed to a same address. The identified write IDs can be used to modify an entry of error memory 229. The write IDs can be used to update the read-after-write results 235. The comparator 221 can store the write IDs and the read ID internally or in memory external to the comparator but internal to the interface 209. The stored commands, the write IDs, and/or the read IDs can be used to retrieve write data 231 under the write ID from the write buffer 224 and store the write data 231 to the read buffer 230 under the write ID.

The error memory 229 can be used to simultaneously provide information regarding a result of the ECC 228 and information regarding which commands write and read data from a same address. The information can be provided to the cache controller 211 and to circuitry configured to store the write data as read data in the read buffer 230.

The error memory 229 can also be used for purposes of determining whether to release a write ID. For instance, if a read-after-write dependence is identified and marked utilizing the read-after-write results 235 then a write ID associated with the read-after-write dependence can be used to prevent the release of the write ID. Traditionally the write ID can be released by providing the write command (e.g., write ID) and corresponding write data from the write buffer 224 and/or the command buffer 222 to the cache controller 211. After the write ID, associated addresses 226, and/or write data 231 are provided to the cache controller 211, then the write ID can be dropped (e.g., deleted) from the write buffer 224, the command buffer 222, and/or the error memory 229. Dropping the write ID from the write buffer 224, the command buffer 222, and/or the error memory 229 can render the write ID available to be used with a different incoming write command.

Although not shown, the comparator 221 can be implemented outside the interface 209 and the cache controller 211. The external comparator 221 can mark the commands in the error memory 229. Marking the commands externally from the interface 209 and/or the cache controller 211 can cause the processing of read commands utilizing the write data of the marked command without providing the read commands to the cache controller 211.

The cache controller 211 can implement commands that are not marked. For example, the cache controller 211 can write data to the cache memory and/or can provide the data to the memory sub-system controller (e.g., memory sub-system controller 104 in FIG. 1) for writing to a memory device of the memory sub-system.

The commands, addresses, and/or data can be received through different streams. The ECC circuitry 223 can be configured to describe attributes of both the addresses of the commands and the data corresponding to the commands utilizing the error memory 229. The attributes can include whether read commands and write commands store data to or read data from a same address. The attributes can also include whether the data corresponding to write commands is corrupt. As such, marking the write commands can include describing attributes of the stream of commands received utilizing command buffer 222, attributes of the stream of data stored in the write buffer 224, and/or attributes of the stream of data stored in the read buffer 230 given that data is stored from the write buffer 224 to the read buffer 230.

In various examples, the comparator 221 can identify two or more write commands addressed to a same address as a read command. The comparator 221 can store the write ID and read ID corresponding to the write commands and the read command, respectively. Each of the write commands can be marked in the error memory 229 utilizing the write IDs corresponding to the write commands. The error memory 229 can be used to determine whether to store data corresponding to the write commands in the read buffer 230.

In some examples, the comparator 221 can identify a last (e.g., newest) write command received from the marked write commands. The comparator 221 can transfer write data 231 corresponding to the latest write command received and identified. The write data 231 can be stored from the write buffer 224 to the read buffer 230 utilizing a read ID corresponding to the read command. As such, entries of the read buffer 230 can include read IDs 225 and read data 233. Responsive to processing the read command, the IDs of the identified write commands can be released.

In some examples, a write command and multiple read commands can be addressed to a same address. The comparator 221 can identify the write command and the read commands as being addressed to a same address. The write ID and the read IDs can be stored by the comparator 221. The comparator 221 can mark the write commands utilizing the error memory 229 and the read-after-write results 235 of the comparison performed by the comparator 221. The interface 209 can cause the write data to be stored to the read buffer 230 utilizing the lines. For example, the interface 209 can generate a first entry into the read buffer 230 comprising a first read ID and the write data. The interface 209 can then generate a second entry into the read buffer 230 comprising the second read ID and the write data in examples where two read commands and a write command are addressed to a same address. In various examples, providing data from the read buffer 230 to a host can include providing the data from the read buffer 230 to input/output lines to provide the data to a host.

Figure 3:
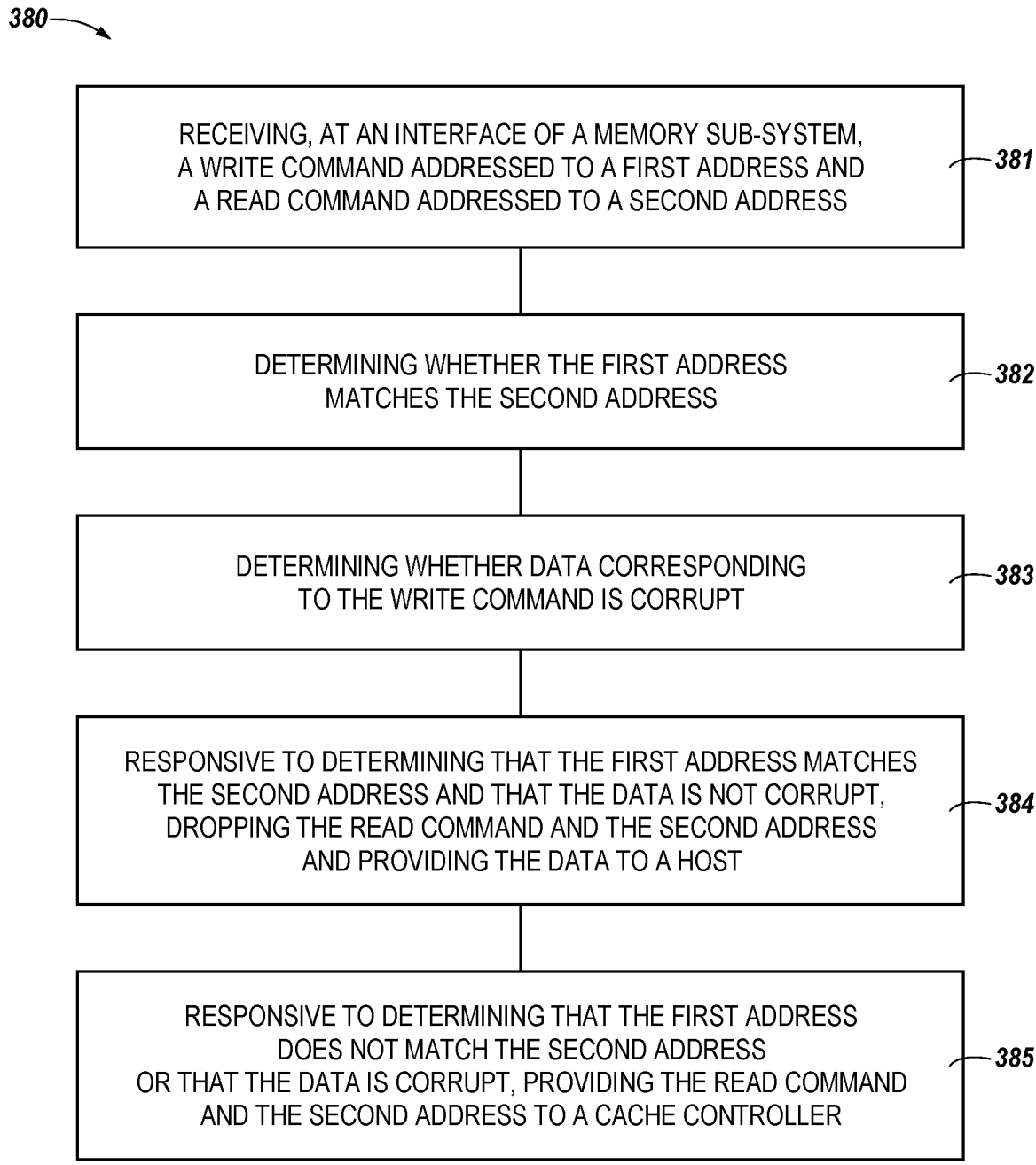
FIG. 3 is a flow diagram of an example method for an interface in accordance with some embodiments of the present disclosure.

FIG. 3 is a flow diagram of an example method 380 for an interface in accordance with some embodiments of the present disclosure. The method 380 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 380 is performed by the interface 109 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 381, a write command addressed to a first address and a read command addressed to a second address can be received at an interface of a memory sub-system. At operation 382, a determination can be made as to whether the first address matches the second address. At operation 383, a determination can be made as to whether data corresponding to the write command is corrupt. At operation 384, responsive to determining that the first address matches the second address and that the data is not corrupt, the read command and the second address can be dropped and the data can be provided to a host. At operation 385, responsive to determining that the first address does not match the second address or that the data is corrupt, the read command and the second address can be provided to a cache controller.

In various examples, the method 380 can further include identifying a write ID of the write command addressed to the first address and a read ID of the read command addressed to the second address responsive to determining that the first address matches the second address. The data can be stored in a read buffer. The data can also be associated with the read ID in the read buffer.

Responsive to determining that the first address does not match the second address and that the data is not corrupt, the write command and the first address can be provided to the cache controller. Responsive to determining that the data is corrupt, the write command and the first address can be provided to the cache controller to be dropped by the cache controller. For example, the cache controller can drop commands and/or corresponding data responsive to a determination that the data is corrupt. The data can be identified as corrupt utilizing an error correction circuitry of the interface.

In various instances, a different write command having a different write ID than a write ID corresponding to the write command can be received. A determination can be made that a write command was received prior to receipt of the different write command. The determination can be stored in the error correction circuitry utilizing a write ID.

A determination can also be made as to whether the write command was received prior to the different write command. The different data can be provided to a host utilizing the read ID responsive to determining that the different write command was received after the write command. Providing the data to the host can also include providing the data to the host responsive determining that the different write command was received prior to the write command.

Figure 4:
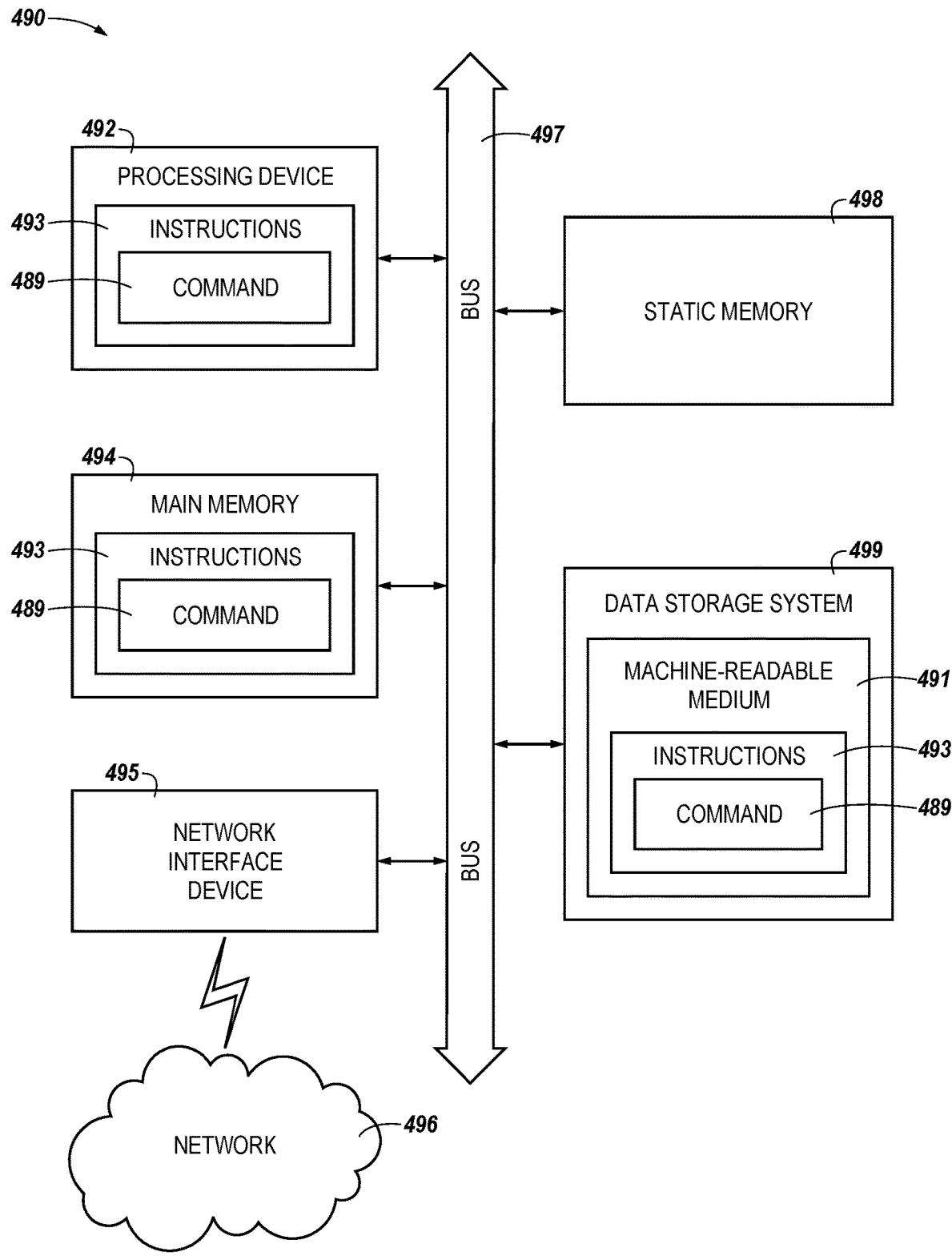
FIG. 4 is a block diagram of an example computer system in which embodiments of the present disclosure may operate.

FIG. 4 illustrates an example machine of a computer system 490 within which a set of instructions, for causing the machine to perform one or more of the methodologies discussed herein, can be executed. In some embodiments, the computer system 490 can correspond to a host system (e.g., the host system 102 of FIG. 1) that includes, is coupled to, or utilizes a memory sub-system (e.g., the memory sub-system 103 of FIG. 1) or can be used to perform the operations of a controller (e.g., to execute an operating system to perform operations corresponding to the interface 109 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or another machine capable of executing a set of instructions (sequential or otherwise) that specify actions to be taken by that machine. Further, while a single machine is illustrated, the term "machine" shall also be taken to include a collection of machines that individually or jointly execute a set (or multiple sets) of instructions to perform one or more of the methodologies discussed herein.

The example computer system 490 includes a processing device 492, a main memory 494 (e.g., read-only memory (ROM), flash memory, dynamic random access memory (DRAM) such as synchronous DRAM (SDRAM) or Rambus DRAM (RDRAM), etc.), a static memory 498 (e.g., flash memory, static random access memory (SRAM), etc.), and a data storage system 499, which communicate with each other via a bus 497.

The processing device 492 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 492 can also be one or more special-purpose processing devices such as an application specific integrated circuit (ASIC), a field programmable gate array (FPGA), a digital signal processor (DSP), network processor, or the like. The processing device 492 is configured to execute instructions 493 for performing the operations and steps discussed herein. The computer system 490 can further include a network interface device 495 to communicate over the network 493.

The data storage system 499 can include a machine-readable storage medium 491 (also known as a computer-readable medium) on which is stored one or more sets of instructions 493 or software embodying one or more of the methodologies or functions described herein. The instructions 493 can also reside, completely or at least partially, within the main memory 494 and/or within the processing device 492 during execution thereof by the computer system 490, the main memory 494 and the processing device 492 also constituting machine-readable storage media. The machine-readable storage medium 491, data storage system 499, and/or main memory 494 can correspond to the memory sub-system 103 of FIG. 1.

In one embodiment, the instructions 493 include instructions to implement functionality corresponding to a compute component (e.g., the interface 109 of FIG. 1). The instructions can include a command instruction 489 associated with merging write commands in an interface of a memory sub-system (e.g., interface 109 in FIG. 1). While the machine-readable storage medium 491 is shown in an example embodiment to be a single medium, the term "machine-readable storage medium" should be taken to include a single medium or multiple media that store the one or more sets of instructions. The term "machine-readable storage medium" shall also be taken to include a medium that is capable of storing or encoding a set of instructions for execution by the machine and that cause the machine to perform one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, types of disk including floppy disks, optical disks, CD-ROMs, and magnetic-optical disks, read-only memories (ROMs), random access memories (RAMs), EPROMs, EEPROMs, magnetic or optical cards, or type of media suitable for storing electronic instructions, each coupled to a computer system bus.

The algorithms and displays presented herein are not inherently related to a particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to a particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes a mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system comprising:
   a memory device;
   a processing device coupled to the memory device and configured to control cache memory for the memory device to store data prior to storing the data on the memory device; and
   an interface of the memory sub-system comprising error correction circuitry and a comparator, wherein the interface is coupled to the processing device and configured to:
      receive a write command addressed to a first address and a read command addressed to a second address from a host;
      receive data corresponding to the write command from the host;

store the write command and the read command in a command buffer of the interface;
store the data in a write buffer of the interface;
determine, using the comparator of the interface, whether the first address matches the second address while the write command and the read command are stored in the command buffer;
determine, using the comparator of the interface, whether the write command was inserted into the command buffer prior to insertion of the read command into the command buffer by comparing a first identifier (ID) of the write command and a second ID of the read command, wherein the first ID and the second ID are assigned sequentially based on an order in which commands are received from the host; and
responsive to determining that the first address matches the second address and that the write command was inserted into the command buffer prior to inserting the read command into the command buffer:
drop the read command and the second address from the command buffer by sending a signal from the comparator to the error correction circuitry to cause the error correction circuitry to mark the read command as being erroneous without regard to performing an error check on the read command and without regard to whether the read command passes an error check if performed, wherein a memory sub-system controller is configured to delete the read command responsive to the read command being marked by the error correction circuitry;
forward the data from the write buffer directly to a read buffer of the interface via lines that couple the write buffer to the read buffer; and
provide the data to the host from the read buffer; and
responsive to determining that the first address does not match the second address, provide the read command and the second address to the processing device.

2. The memory sub-system of claim 1, wherein the interface is further to, responsive to determining that the first address matches the second address, provide the data to the host without providing the read command and the second address to the processing device.

3. The memory sub-system of claim 2, wherein the interface is further configured to:
responsive to determining that the first address matches the second address, drop the read command and the second address from the command buffer prior to providing commands in the command buffer to the processing device.

4. The memory sub-system of claim 3, wherein the interface is further configured to provide the data from the read buffer to input/output lines to provide the data to the host.

5. A method comprising:
receiving, at an interface of a memory sub-system and from a host, a write command addressed to a first address and a read command addressed to a second address;
storing the write command and the read command in a command buffer of the interface;
determining, using a comparator of the interface, whether the first address matches the second address while the write command and the read command are stored in the command buffer;
determining, using the comparator of the interface, whether the write command was inserted into the command buffer prior to insertion of the read command into the command buffer by comparing a write identifier (ID) of the write command and a read ID of the read command, wherein the write ID and the read ID are assigned sequentially based on an order in which commands are received from the host;
determining whether data stored in a write buffer of the interface and corresponding to the write command is corrupt;
responsive to determining that the first address matches the second address, that the data is not corrupt, and that the write command was inserted into the command buffer prior to inserting the read command into the command buffer:
dropping, at the interface, the read command and the second address from the command buffer by sending a signal from the comparator to error correction circuitry of the interface to cause the error correction circuitry to mark the read command as being erroneous without regard to performing an error check on the read command and without regard to whether the read command passes an error check if performed, wherein a memory sub-system controller is configured to delete the read command responsive to the read command being marked by the error correction circuitry;
forwarding the data from the write buffer directly to a read buffer of the interface via lines that couple the write buffer to the read buffer; and
providing the data to the host from the read buffer; and
responsive to determining that the first address does not match the second address or that the data is corrupt, providing the read command and the second address to a processing device coupled to a memory device of the memory sub-system and configured to control cache memory for the memory device to store data prior to storing the data on the memory device.

6. The method of claim 5, further comprising identifying the write ID of the write command addressed to the first address and the read ID of the read command addressed to the second address responsive to determining that the first address matches the second address.

7. The method of claim 6, further comprising storing the data in the read buffer and associating the data in the read buffer with the read ID.

8. The method of claim 5, further comprising responsive to determining that the first address does not match the second address and that the data is not corrupt, providing the write command and the first address to the processing device.

9. The method of claim 5, further comprising responsive to determining that the first address does match the second address and that the data is not corrupt, providing the read command and the read address to the processing device.

10. The method of claim 5, further comprising responsive to determining that the data is corrupt, providing the write command and the first address to the processing device to be dropped by the processing device.

11. The method of claim 5, further comprising determining whether the data corresponding to the write command is corrupt utilizing the error correction circuitry.

12. The method of claim 11, further comprising:
receiving a different write command having a different write ID than a write ID corresponding to the write command;

determining that the write command was received prior to the different write command; and storing the determination of whether the first address matches the second address in the error correction circuitry utilizing the different write ID.

13. The method of claim 12, further comprising:

determining whether the write command was received prior to the different write command;

providing different data to the host utilizing the read ID responsive to determining that the different write command was received after the write command; and wherein providing the data to the host further comprises providing the data to the host responsive to determining that the different write command was received prior to the write command.

14. A memory sub-system, comprising:

a memory device;

a processing device coupled to the memory device and configured to control cache memory for the memory device to store data prior to storing the data on the memory device;

an interface of the memory sub-system comprising error correction circuitry and a comparator, wherein the interface is coupled to the processing device and configured to:

receive a write command addressed to a first address and a first read command and a second read command addressed to a second address from a host;

receive data corresponding to the write command from the host;

store the write command, the first read command, and the second read command in a command buffer of the interface;

store the data in a write buffer of the interface;

determine, using the comparator of the interface, whether the write command was inserted into the command buffer prior to insertion of the first read command and the second read command into the command buffer by comparing a write identifier (ID) of the write command, a first read ID of the first read command, and a second read ID of the second read command, wherein the write ID, the first read ID, and the second read ID are assigned sequentially based on an order in which commands are received from the host;

responsive to determining that the first address matches the second address and that the write command was inserted into the command buffer prior to inserting the read command into the command buffer using the comparator of the interface while the write command, the first read command, and the second read command are stored in the command buffer and that the data is not corrupt:

drop the first read command, the second read command, and the second address from the command buffer by sending a signal from the comparator to the error correction circuitry to cause the error correction circuitry to mark the first read command and the second read command as being erroneous without regard to performing an error check on the read command and without regard to whether the read command passes an error check if performed, wherein a memory sub-system controller is configured to delete the first read command and the second read command responsive to the first read command and the second read command being marked by the error correction circuitry;

forward the data from the write buffer directly to a read buffer of the interface via lines that couple the write buffer to the read buffer; and provide the data to the host from the read buffer; and responsive to determining that the first address does not match the second address or that the data is corrupt while the write command, the first read command, and the second read command are stored in the command buffer, provide the first read command, the second read command, and the second address to the processing device for processing.

15. The memory sub-system of claim 14, wherein the interface is further configured to:

store a first determination that the data is not corrupt in the error correction circuitry utilizing the write ID of the write command;

store a second determination that the first address matches the second address in the error correction circuitry utilizing the write ID; and refrain from releasing the write ID until the data has been stored to the read buffer utilizing the first read ID and the second read ID corresponding to the first read command and the second read command, respectively.

16. The memory sub-system of claim 15, wherein the interface is further configured to refrain from releasing the write ID until the data has been stored to the read buffer responsive to the second determination regardless of whether the write command has been provided to the processing device or not.

17. The memory sub-system of claim 14, wherein the interface is further configured to:

store a determination that the data is corrupt in the error correction circuitry utilizing the write ID of the write command; and release the write ID responsive to providing the write command to the processing device regardless of whether the first address matches the second address.

* * * * *